United States Patent [19]
Voogel

[11] Patent Number: 6,157,213
[45] Date of Patent: Dec. 5, 2000

[54] LAYOUT ARCHITECTURE AND METHOD FOR FABRICATING PLDS INCLUDING MULTIPLE DISCRETE DEVICES FORMED ON A SINGLE CHIP

[75] Inventor: Martin L. Voogel, Santa Clara, Calif.

[73] Assignee: Xilinx, Inc., San Jose, Calif.

[21] Appl. No.: 09/175,291

[22] Filed: Oct. 19, 1998

[51] Int. Cl.$^7$ ................................................. H01L 25/00
[52] U.S. Cl. .......................... 326/41; 326/101; 257/670
[58] Field of Search ............................... 326/101, 41, 47, 326/39; 257/620, 207, 208

[56] References Cited

U.S. PATENT DOCUMENTS

| | | | |
|---|---|---|---|
| 5,059,899 | 10/1991 | Farnworth et al. | 324/158 R |
| 5,696,404 | 12/1997 | Murari et al. | 257/620 |
| 5,767,565 | 6/1998 | Reddy | 257/620 |

OTHER PUBLICATIONS

Michael Adler, "GE High Density Interconnect: A Solution to the System Interconnect Problem", General Electric, Corporate Research and Development, Schenectady, NY, publication date believed to be Aug. 26, 1991.

*Primary Examiner*—Michael Tokar
*Assistant Examiner*—Anh Tran
*Attorney, Agent, or Firm*—Bever, Hoffman & Harms, LLP; Patrick T. Bever; Lois D. Cartier

[57] ABSTRACT

A wafer layout architecture and a method for producing multi-device PLDs wherein the wafer layout architecture includes device-linking conductors that allow a wafer to be diced into both single-device chips and multi-device chips. A multi-device chip is a single chip that includes two or more discrete PLD circuits that are connected by the device-linking conductors. Each device-linking conductor is formed on the wafer and extends across a scribe line space separating two discrete FPGA circuits. When the two discrete FPGA circuits are separated during a dicing process, the wafer is cut along the scribe line space and the device-linking conductor is severed. When a multi-device chip is formed that includes both of the discrete FPGA circuits, the device-linking conductor is selectively implemented using programmable switches to provide a signal path between the two discrete FPGA circuits. Because the device-linking conductors are formed on the chip, the device-linking conductors provide on-chip signal transmissions having substantially less delay than off-chip signal transmission methods.

12 Claims, 8 Drawing Sheets

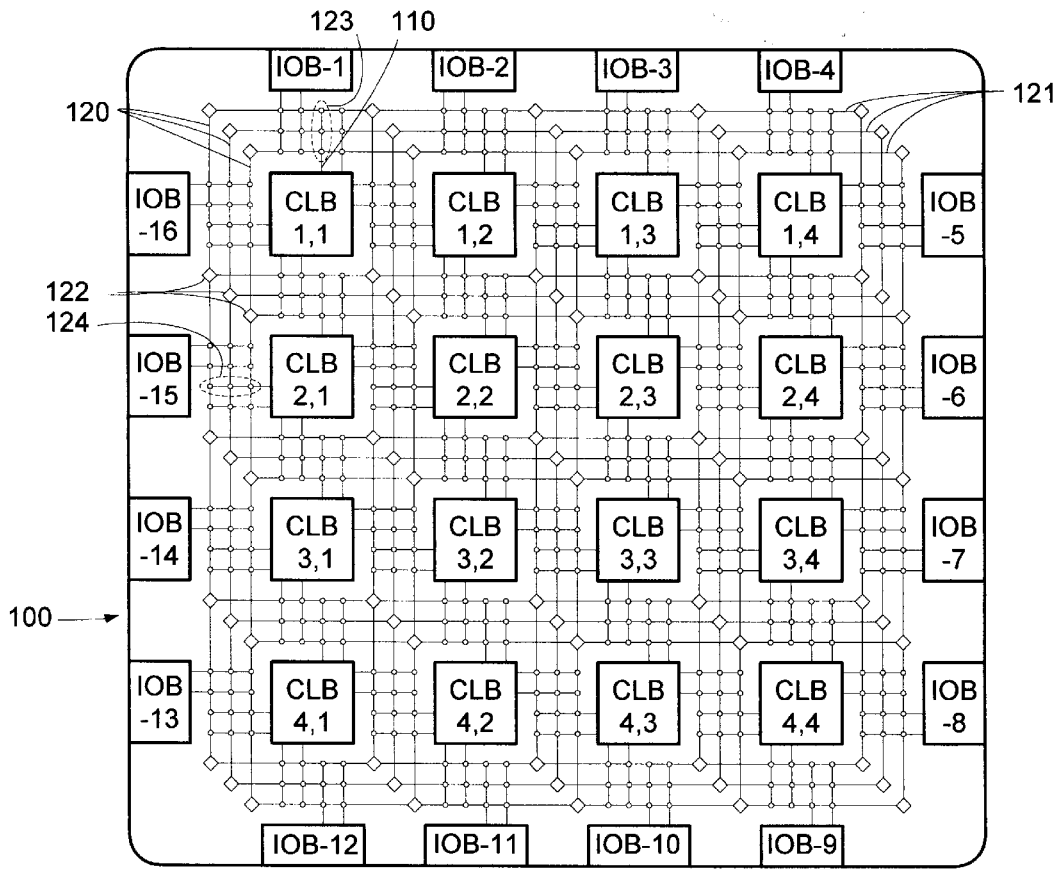
FIG. 1(A)
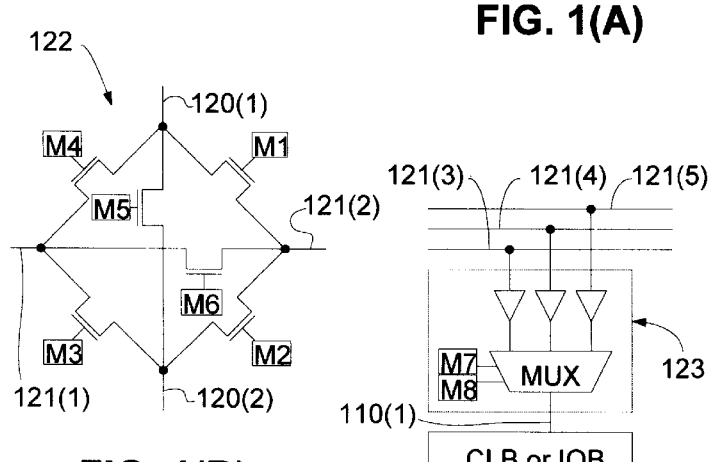
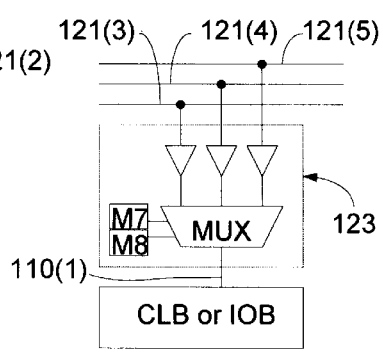
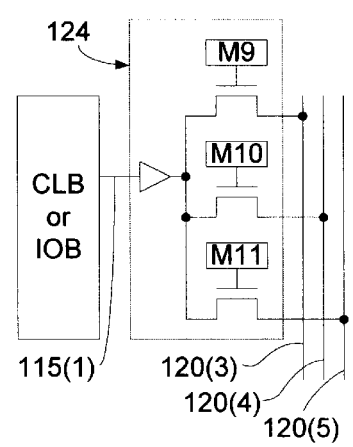
**FIG. 1(B)
(PRIOR ART)**
**FIG. 1(C)
(PRIOR ART)**
**FIG. 1(D)
(PRIOR ART)**

LAYOUT ARCHITECTURE AND METHOD FOR FABRICATING PLDS INCLUDING MULTIPLE DISCRETE DEVICES FORMED ON A SINGLE CHIP

FIELD OF THE INVENTION

The present invention relates to programmable logic devices (PLDs), and more particularly to a layout architecture and method for fabricating PLDs including multiple discrete devices formed on a single semiconductor substrate (chip).

BACKGROUND OF THE INVENTION

Programmable logic devices (PLDs) typically include a plurality of logic elements and associated interconnect resources that are programmed by a user to implement user-defined logic operations (e.g., an application specific circuit design). A PLD is typically programmed using programming software that is provided by the PLD's manufacturer, a personal computer or workstation capable of running the programming software, and a device programmer. In contrast, application specific integrated circuits (ASICs) have fixed-function logic circuits and fixed signal routing paths, and require a protracted layout process and an expensive fabrication process to implement a user's logic operation. Because PLDs can be utilized to implement logic operations in a relatively quick and inexpensive manner, PLDs are often preferred over ASICs for many applications.

FIG. 1(A) shows an example of a field programmable gate array (FPGA) 100, which is one type of PLD. Although greatly simplified, FPGA 100 is generally consistent with XC3000™ series FPGAs, which are produced by Xilinx, Inc. of San Jose, Calif.

FPGA 100 includes an array of configurable logic blocks (CLBs) 1,1 through 4,4 surrounded by input/output blocks (IOBs) IOB-1 through IOB-16, and programmable interconnect resources that include vertical interconnect segments 120 and horizontal interconnect segments 121 extending between the rows and columns of CLBs and IOBs. The CLBs, IOBs and programmable interconnect resources of FPGA 100 form a discrete circuit that resides on a silicon chip.

Each CLB includes configurable combinational circuitry and optional output registers that are programmed to implement logic in accordance with CLB configuration data stored in configuration memory cells (not shown) of FPGA 100. Data is transmitted into each CLB on input wires 110 and is transmitted from each CLB on output wires 115. The configurable combinational circuitry of each CLB implement a portion of a logic operation responsive to signals received on input wires 110 in accordance with the CLB configuration data stored in the configuration memory cells associated with that CLB. Similarly, the optional output registers of each CLB transmit signals from the CLB onto a selected output wire 115 in accordance with the stored CLB configuration data. Typically, all of the CLBs of an FPGA include identical configurable circuitry.

Each IOB includes configurable circuitry that is controlled by associated configuration memory cells, which are programmed to store IOB configuration data. In accordance with the IOB configuration data, each IOB selectively allows an associated pin (not shown) of FPGA 100 to be used either for receiving input signals from other devices, or for transmitting output signals to other devices. Similar to the CLBs, all of the IOBs of an FPGA typically include identical configurable circuitry.

The programmable interconnect resources of FPGA 100 are configured using various switches to generate signal paths for passing input and output signals between the CLBs and IOBs. These various switches include segment-to-segment switches, segment-to-CLB/IOB input switches, and CLB/IOB-to-segment output switches. Segment-to-segment switches include configurable circuitry that selectively connects wiring segments to form signal paths. Segment-to-CLB/IOB input switches include configurable circuitry that selectively connects the input wire 110 of a CLB (or IOB) to the end of a signal path. CLB/IOB-to-segment output switches include configurable circuitry that selectively connects the output wire 115 of a CLB (or IOB) to the beginning of a signal path.

FIG. 1(B) shows an example of a six-way segment-to-segment switch 122 that selectively connects vertical wiring segments 120(1) and 120(2), and horizontal wiring segments 121(1) and 121(2), in accordance with six-way switch configuration data stored in configuration memory cells M1 through M6. Six-way switch 122 includes normally-open pass transistors that are turned on to provide a signal path (or branch) between any two (or more) of the wiring segments in accordance with the six-way switch configuration data. For example, a signal path is provided between vertical wiring segment 120(1) and vertical wiring segment 120(2) by programming memory cell M5 to turn on its associated pass transistor. Similarly, a signal path is provided between vertical wiring segment 120(1) and horizontal wiring segment 121(2) by programming memory cell M1 to turn on its associated pass transistor. Similar signal paths between any two (or more) wiring segments are provided by selectively programming the relevant memory cell (or memory cells).

FIG. 1(C) shows an example of a segment-to-CLB/IOB input switch 123 that selectively connects an input wire 110(1) of a CLB (or IOB) to one or more interconnect wiring segments in accordance with input switch configuration data stored in configuration memory cells M7 and M8. Segment-to-CLB/IOB input switch 123 includes a multiplexer (MUX) having inputs connected to horizontal wiring segments 121 (3) through 121(5) through buffers, and an output that is connected to CLB/IOB input wire 110(1). Memory devices M7 and M8 transmit control signals on select lines of the MUX such that the MUX passes a signal from one of the wiring segments 121(3) through 121(5) to the associated CLB (or IOB).

FIG. 1(D) shows an example of a CLB/IOB-to-segment output switch 124 that selectively connects an output wire 115(1) of a CLB (or IOB) to one or more interconnect wiring segments in accordance with input switch configuration data stored in configuration memory cells M9 through M11. CLB/IOB-to-segment output switch 124 includes three pass transistors connected between output wire 115(1) and horizontal wiring segments 120(3) through 120(5), and gates that are connected memory cells M9 through M11. Memory devices M9 through M11 store output switch configuration data that turns on selected pass transistors to pass output signals from the CLB (or IOB) to one or more of wiring segments 120(3) through 120(5).

As with most types of integrated circuits, PLD circuits are fabricated on silicon wafers using known silicon processing techniques. After the PLD circuits are formed, the wafers are diced into individual "chips", each chip including one PLD circuit. These chips are then packaged using known packaging technologies to form PLDs.

FIG. 2(A) is a simplified plan view showing a silicon wafer 200 that is fabricated to include multiple discrete circuits 210, each circuit 210 corresponding to one conventional FPGA 100 (see FIG. 1(A)). Each circuit 210 is separated from other circuits on wafer 200 by horizontal scribe lines 220 and vertical scribe lines 230. These scribe lines provide a predetermined distance between adjacent circuits 210 to prevent damage during the dicing process.

FIG. 2(B) is an enlarged view showing additional details regarding the fabrication of circuits 210 on wafer 200. In particular, FIG. 2(B) shows a portion of a row including circuits 210(1) and 210(2), each depicted with circuitry corresponding to the CLBs, IOBs and interconnect lines of FPGA 100 (see FIG. 1(A)). Circuit 210(1) is formed in an area defined by horizontal scribe lines 220(1) and 220(2), and vertical scribe lines 230(1) and 230(2). Similarly, circuit 210(2) is formed in an area defined by horizontal scribe lines 220(1) and 220(2), and vertical scribe lines 230(2) and 230(3). Note that circuit 210(1) is completely separated (electrically isolated) by vertical scribe line 230(2) from circuit 210(2). In particular, none of the interconnect lines of either circuit extends across vertical scribe line 230(2). Referring back to FIG. 2(A), all circuits 210 of wafer 200 are likewise separated by horizontal scribe lines 220 and vertical scribe lines 230.

FIG. 2(C) is a further enlarged view of wafer 200 showing further details associated with IOB circuits 240(1) and 240(2), which are respectively associated with circuit 210(1) and 210(2) (see FIG. 2(B)). Each IOB 240(1,2) is programmed to operate in either an input mode or an output mode by an output enable (OE) signal that is generated, for example, by configuration memory cells (not shown) of its associated circuit 210(1,2). The OE signal is transmitted to the first input of a two-input NAND gate 241, and through an inverter 242 to the first input of a two-input NOR gate 243. Each IOB 240(1) and 240(2) also receives data output (DATA OUT) signals from the CLBs of its associated circuit 210(1) and 240(2) via the interconnect lines (not shown). The DATA OUT signals are transmitted to the second inputs of NAND gate 241 and NOR gate 243. The output of NAND gate 241 is transmitted to the gate of a PMOS pull-up transistor 244 that is connected between Vcc and a bonding pad 246. The output of NOR gate 243 is transmitted to the gate of an NMOS pull-down transistor 245 that is connected between bonding pad 246 and ground. Bonding pad 246 is also connected through an input buffer 247 to a DATA IN line that transmits data input signals to the internal circuitry via the interconnect lines (not shown). After wafer 200 is diced into chips and the chips are mounted onto packages, bonding pads 246 of IOBs 240(1) and 240(2) are typically connected to, for example, pins of their respective package using wire bonding techniques. Note that, similar to the interconnect lines shown in FIG. 2(B), bonding pads 246 of IOBs 240(1) and 240(2) are separated by vertical scribe line 230(2).

FPGA manufacturers are constantly designing and manufacturing larger, faster FPGAs to keep pace with ever-increasing user demands. However, the largest currently available FPGA is restricted by a maximum reticle size of 22 mm by 22 mm, and is sometimes found to provide insufficient resources for some large user-defined logic operations.

A first method typically used to implement large user-defined logic operations is to connect together several individually packaged FPGAs on a printed circuit board (PCB). A problem with this method is that the connections must be made through the IOBs of the FPGAs and through conductors formed on the PCB, which limits the number of signal paths between the FPGAs and creates undesirable signal delays. Another problem is that the individually packaged FPGAs take up a large area of the PCB, thereby limiting miniaturization of the resulting product.

A second method that may be used to implement large user-defined logic operations is to combine two or more chips, each having a single FPGA circuit, in a multi-chip module (MCM) package. MCM packages provide a single base for supporting the two or more chips, and include conductors in the base that provide electrical connections between the FPGA circuits of the chips. However, contact between the chips and the conductors is prone to misalignment, thereby significantly decreasing system performance. Moreover, mounting the two or more chips onto the base requires an additional manufacturing step that increases manufacturing costs. Further, problems associated with limited signal paths and signal delays, similar to those associated with the first method (discussed above), are caused by signal transmission through the base.

A third method that may be used to implement large user-defined logic operations is to utilize an interconnection structure, commonly known as chip-on-board, in which bare chips are mounted on a board and interconnected by wire bonding techniques. Chip-on-board structures increase package density compared to conventional MCM packaging, thereby reducing system delays caused by transmission through the MCM package base. However, chip-on-board structures are expensive due to the physical operation of attaching wires between the individual bonding pads and the board. In addition, although reduced when compared to MCM packages, significant signal delays are still caused by signal transmission through the IOBs of the FPGA circuits, and through the wire bonds and conductors provided on the board. In addition, the same problem associated with limited signal paths discussed above also applied to the third method.

What is needed is a PLD layout architecture for fabricating a wafer that can be selectively diced into both single-device chips and multi-device chips.

SUMMARY OF THE INVENTION

The present invention provides a wafer layout architecture and a method for producing PLDs in which the wafer layout architecture includes device-linking conductors that allow a wafer to be diced into both single-device chips and multi-device chips. A multi-device chip is a single chip that includes two or more discrete FPGA circuits that are connected by the device-linking conductors. Each device-linking conductor is formed on the wafer and extends across a scribe line space separating two discrete FPGA circuits. When the two discrete FPGA circuits are separated during a dicing process, the wafer is cut along the scribe line space and the device-linking conductor is severed. As a default condition, the severed device-linking conductors are programmably disconnected from each of the separated FPGA circuits. When a multi-device chip is formed that includes both of the discrete FPGA circuits, the device-linking conductor provides a signal path between the two discrete FPGA circuits, thereby providing on-chip signal transmissions having substantially less delay than the off-chip signal transmissions required by prior art methods.

In accordance with a first aspect of the present invention, a multi-device PLD includes two discrete PLD circuits formed on a single semiconductor chip that are electrically connected by device-linking conductors. The discrete PLD circuits are separated by a scribe line space, and the device-linking conductors extend across the scribe line space and are connected to the interconnect resources of the PLD circuits through programmable switches. Data signals are transmitted between the two discrete PLD circuits directly through the interconnect resources, thereby avoiding the signal delays associated with transmission through the IOBs and increasing the number of potential signal paths between the discrete PLD circuits.

In accordance with a second aspect of the present invention, the wafer layout architecture includes discrete programmable logic device (PLD) circuits fabricated in rows and columns on a semiconductor wafer that are connected by device-linking conductors. Each PLD circuit includes logic circuits and interconnect resources for selectively providing signal paths between the logic circuits. The PLD circuits are separated by scribe line spaces that extend between the rows and columns of PLD circuits. The device-linking conductors extend across the scribe line spaces and connect the interconnect resources of the PLD circuits through programmable switches. On-chip signal transmissions between the logic circuits of the discrete PLDs are provided by selectively programming the programmable switches to transmit signals over the device-linking conductors.

In accordance with a third aspect of the present invention, a method for generating multi-device PLDs includes forming wafers having the layout architecture of the first aspect, and then dicing the wafer such that a single chip includes two or more PLD circuits connected by the device-linking conductors. The decision to dice the wafer into chips including two, four or more PLD circuits can be determined, for example, by defect density and product demand.

BRIEF DESCRIPTION OF THE DRAWINGS

FIG. 1(A) is a simplified schematic diagram showing a portion of simplified conventional FPGA.

FIGS. 1(B), 1(C) and 1(D) are diagrams showing switch circuits utilized to route signals in the conventional FPGA of FIG. 1(A).

DETAILED DESCRIPTION OF THE DRAWINGS

The present invention is directed to a wafer layout architecture and a method for fabricating multi-device PLDs that is particularly directed to Field Programmable Gate Arrays (FPGAs). Although the layout architecture and Fabrication methods are described herein with reference to FPGAs, these methods may be beneficially utilized to produce other types of multi-device PLDS. Therefore, the appended claims should not necessarily be limited to architectures and methods associated with FPGAs.

Figure 3:
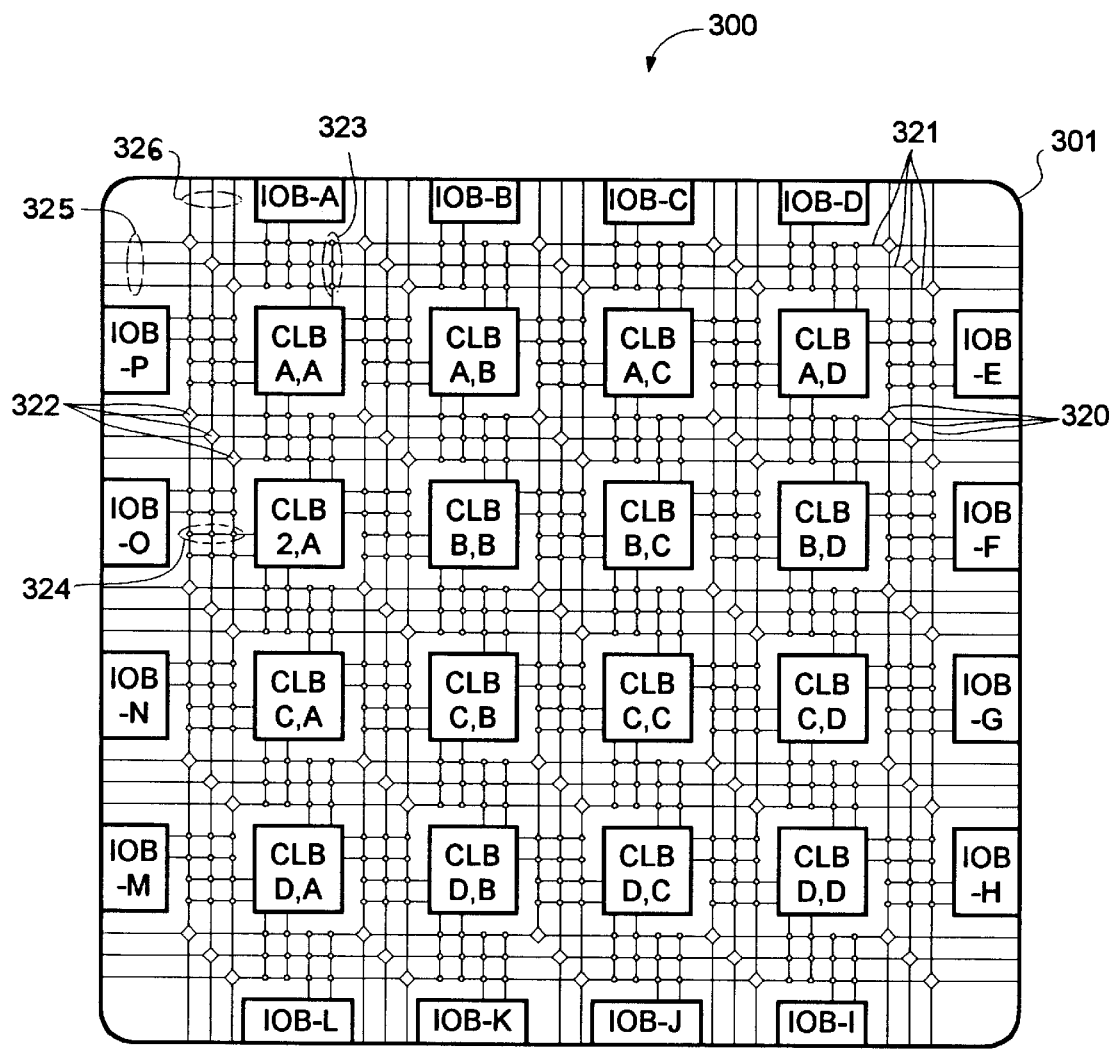
FIG. 3 is a simplified schematic diagram showing an example of a simplified FPGA in accordance with a first embodiment of the present invention.

FIG. 3 depicts an FPGA circuit 300 fabricated on a silicon chip 301 in accordance with a first embodiment of the present invention. FPGA circuit 300 includes an array of CLBs A,A through D,D and peripherally-located IOBs A through P that are the same as those described above with respect to conventional FPGA 100 (discussed above with reference to FIG. 1(A)). FPGA circuit 300 also includes programmable interconnect resources that utilize connection switches similar to those of conventional FPGA 100. Specifically, FPGA circuit 300 includes six-way segment-to-segment switches 322 that are the same as switch 122 shown in FIG. 1(B), segment-to-CLB/IOB input switches 323 that are the same as switch 123 shown in FIG. 1(C), and CLB/IOB-to-segment output switches 324 that are the same as switch 124 shown in FIG. 1(D).

In accordance with an aspect of the present invention, FPGA circuit 300 includes modified interconnect lines that extend to the edge of chip 301. Specifically, the programmable interconnect resources of FPGA circuit 300 include vertical interconnect segments 320 and horizontal interconnect segments 321 extending between the rows and columns of CLBs and IOBs. Each horizontal interconnect segment 321 includes a horizontal end section 325 that extends to a vertical (left or right) edge of chip 301, and each vertical interconnect segments 320 includes a vertical end section 326 that extends to a horizontal (top or bottom) edge of chip 301. Horizontal end sections 325 and vertical end sections 326 are selectively connected to the remaining vertical interconnect segments 320 and horizontal interconnect segments 321 via segment-to-segment switches 322. As discussed below, horizontal end sections 325 and vertical end sections 326 form device-linking conductors that facilitate the production of multi-device PLDs.

Figure 4A:
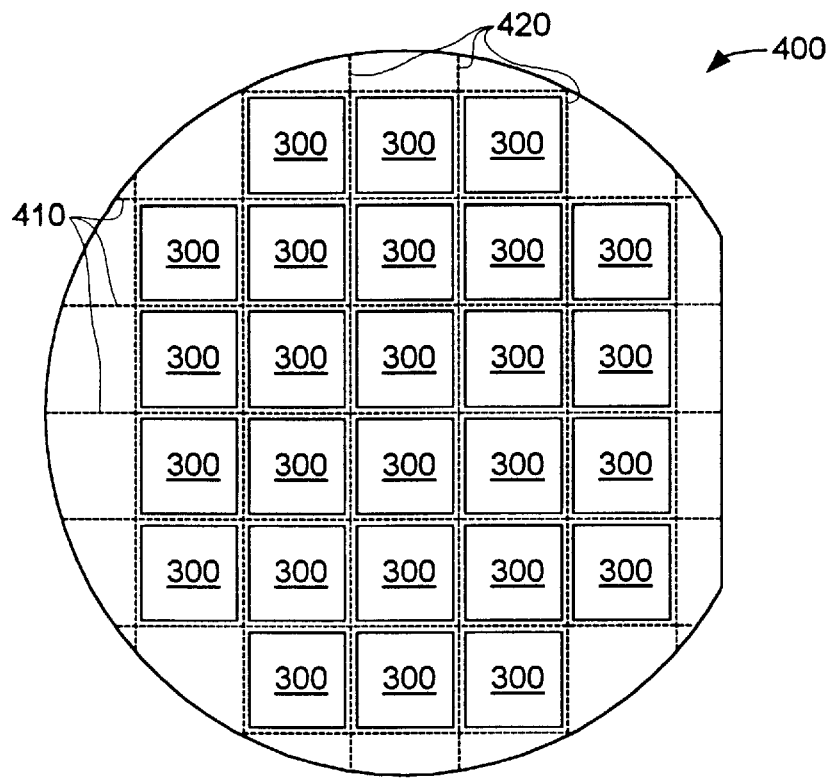
FIG. 4(A) is a simplified plan view showing a silicon wafer fabricated to include multiple FPGAs prior to dicing.

FIG. 4(A) is a simplified plan view showing a silicon wafer 400 that is fabricated to include a layout architecture according to another aspect of the present invention. Wafer 400 includes several FPGA circuits 300 (discussed above) that are fabricated using known silicon processing techniques. Horizontal scribe lines 410 and vertical scribe lines 420 extend along spaces (referred to herein as a scribe line space) located between the rows and columns of FPGA circuits 300. Each scribe line space provides a predetermined distance between the peripheral components of adjacent FPGA circuits 300 to prevent damage to these peripheral components during a subsequent dicing process. After the FPGA circuits are formed, the wafers are tested and diced along selected scribe lines to form chips, each chip including at least one FPGA circuit. The FPGA circuits that fail to function properly during testing are separated from functioning FPGA circuits during the dicing process. Alternatively, the dicing process may produce chips including one or more disfunctional FPGA circuits that are subsequently programmably disconnected from functional FPGA circuits on each chip. These FPGA chips are then packaged to produce PLDs.

Figure 4B:
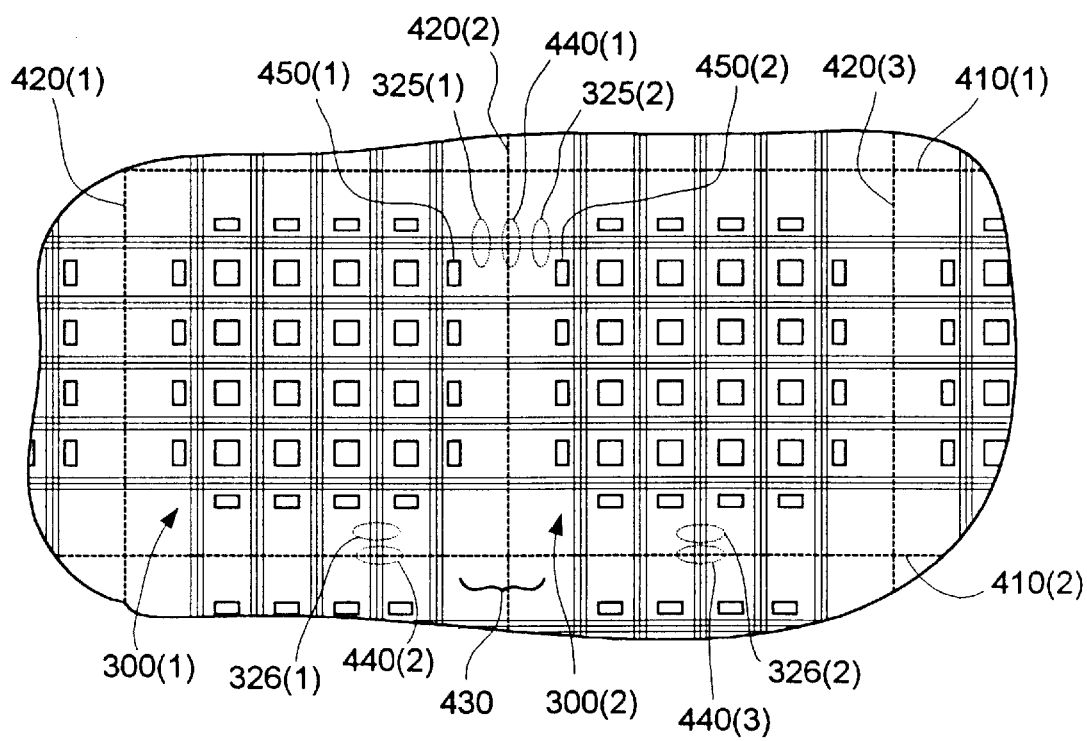
FIG. 4(B) is a partial plan view showing additional details of the wafer shown in FIG. 4(A).

FIG. 4(B) shows an enlarged portion of wafer 400, and illustrates additional details regarding the layout architecture of the present invention. In particular, FIG. 4(B) shows a portion of a row including FPGA circuits 300(1) and 300(2), each generally depicted with the CLBs, IOBs and interconnect lines of FPGA circuit 300 (see FIG. 3). FPGA circuit 300(1) is formed in an area of wafer 400 defined by horizontal scribe lines 410(1) and 410(2), and vertical scribe lines 420(1) and 420(2). Similarly, FPGA circuit 300(2) is formed in an area defined by horizontal scribe lines 410(1) and 410(2), and vertical scribe lines 420(2) and 420(3). FPGA circuit 300(1) and FPGA circuit 300(2) are separated by a vertically aligned scribe line space 430, through which vertical scribe line 420(2) passes.

In accordance with the present invention, the layout architecture of wafer 400 provides a plurality of device-linking conductors, formed on wafer 400, that extend across the scribe line spaces to electrically connect the FPGA circuits located on opposite sides of the scribe lines. For example, FPGA circuit 300(1) is electrically connected to FPGA circuit 300(2) by respective horizontal end segments 325(1) and 325(2) that meet at scribe line 320(2) to form continuous device-linking conductors 440(1). Similarly, FPGA circuits 300(1) and 300(2) are electrically connected to adjacent FPGA circuits by vertical end segments 326(1) and 326(2) that form device-linking conductors 440(2) and 440(3) crossing horizontal scribe line 410(2). As discussed below, device-linking conductors 440(1) provide signal paths between discrete FPGA circuits 300(1) and 300(2) that allow the formation of multi-device chips (i.e., chips that include more than one discrete FPGA circuit 300).

In accordance with another aspect of the present invention, multi-device PLDs are formed by dicing wafer 400 such that at least one of the resulting silicon chips includes two or more FPGA circuits 300. For example, a multi-device PLD including FPGA circuits 300(1) and 300(2) is formed by dicing wafer 400 along horizontal scribe lines 410(1) and 410(2), and along vertical scribe lines 420(1) and 420(3). The portion of scribe line space 430 located between FPGA circuits 300(1) and 300(2) remains intact, thereby preserving the electrical connections provided by device-linking conductors 440(1). This method also allows the production of multi-device PLDs including more than two FPGA circuits 300. Further, a "wafer scale" PLD can be formed using the layout architecture of the present invention by providing a suitable package for wafer 400.

Figure 2A:
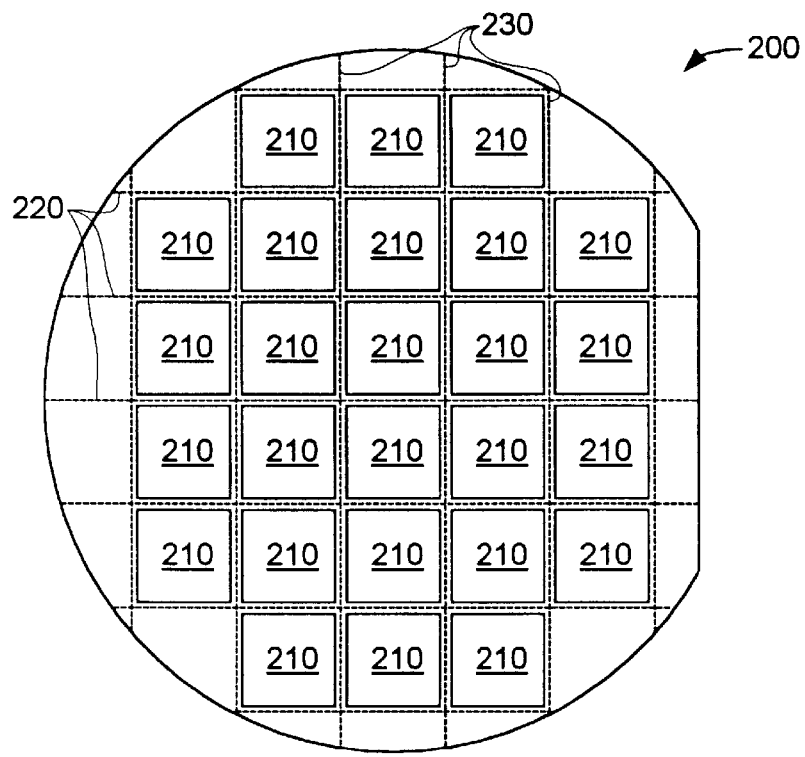
FIG. 2(A) is a simplified plan view showing a silicon wafer fabricated to include multiple conventional FPGAs prior to dicing.
Figure 2B:
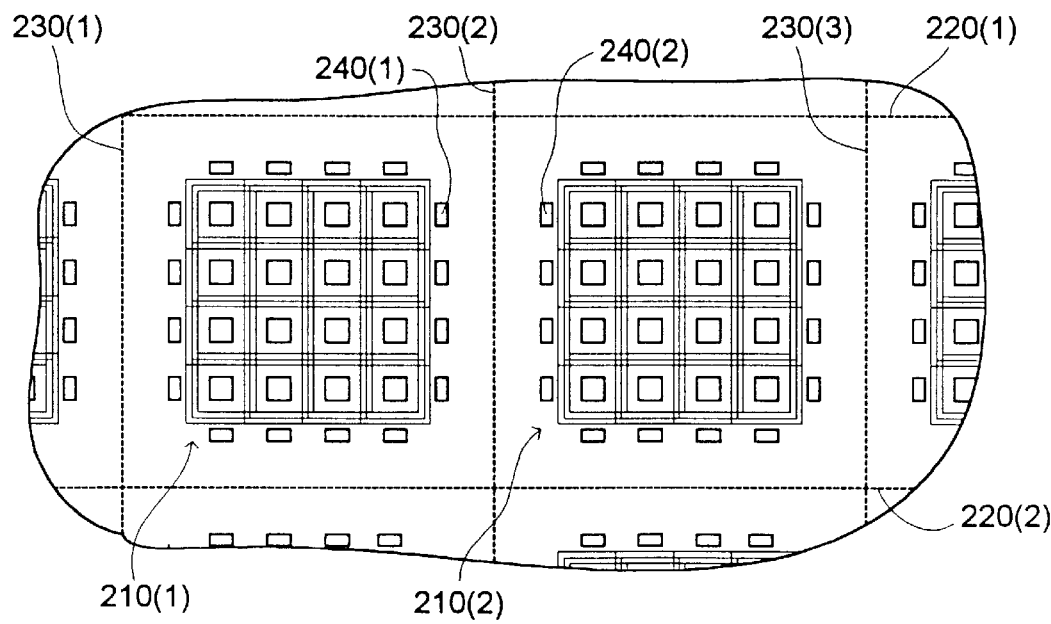
FIG. 2(B) is a partial plan view showing additional details of the wafer shown in FIG. 2(A).
Figure 2C:
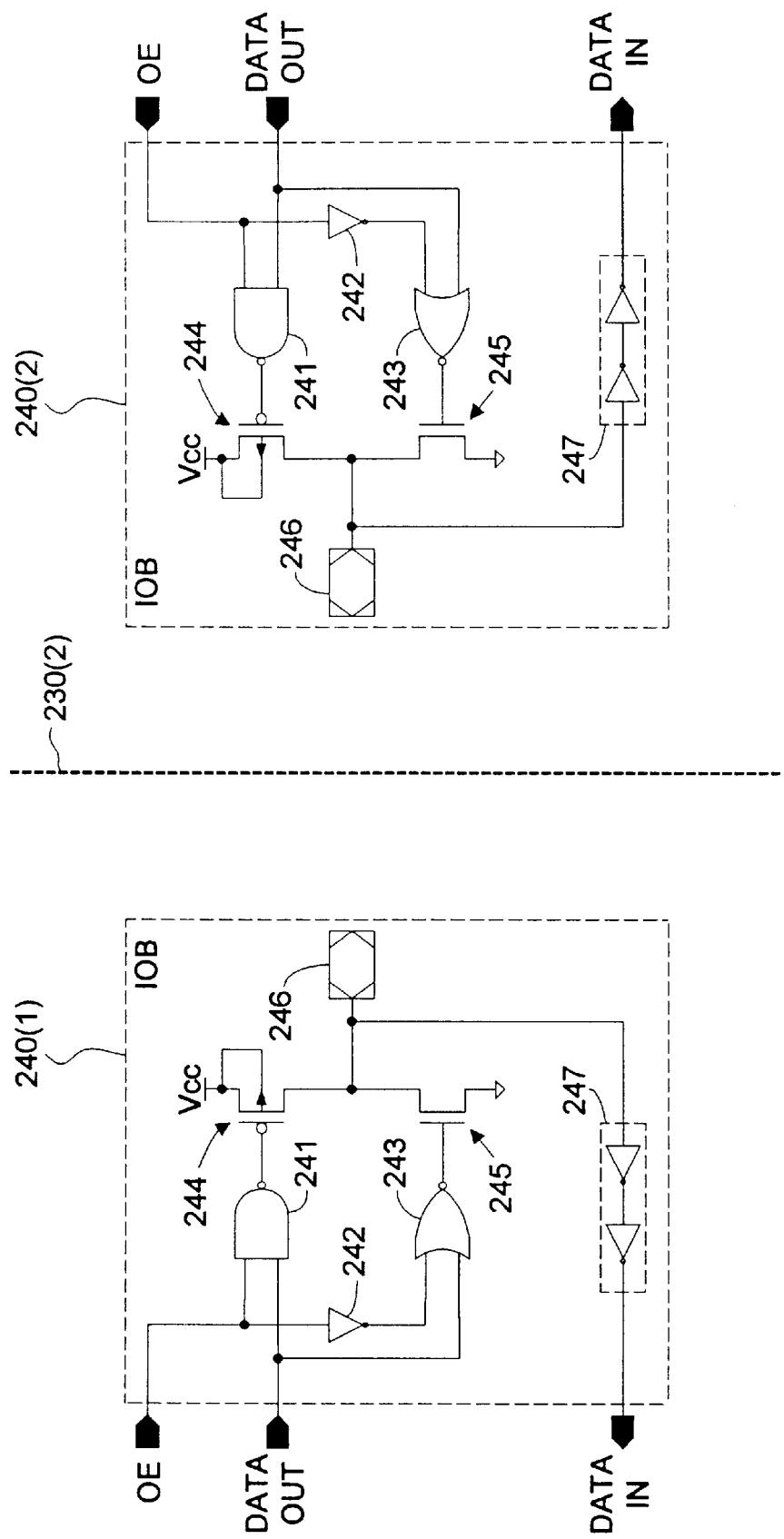
FIG. 2(C) is a partial plan view showing further details of the wafer shown in FIG. 2(A).

Referring briefly to FIGS. 2(A) and 2(B), conventional wafer 200 cannot be used to form multi-device chips because, even if dicing were controlled to produce chips containing two or more circuits 210, wire bond connections must still be made between the circuits 210 via the IOBs. However, because of the limited number of IOBs separating adjacent circuits 210 on wafer 200, such wire bond connections may not provide a sufficiently large number of signal paths to fully utilize the resulting multi-device chip.

Figure 5A:
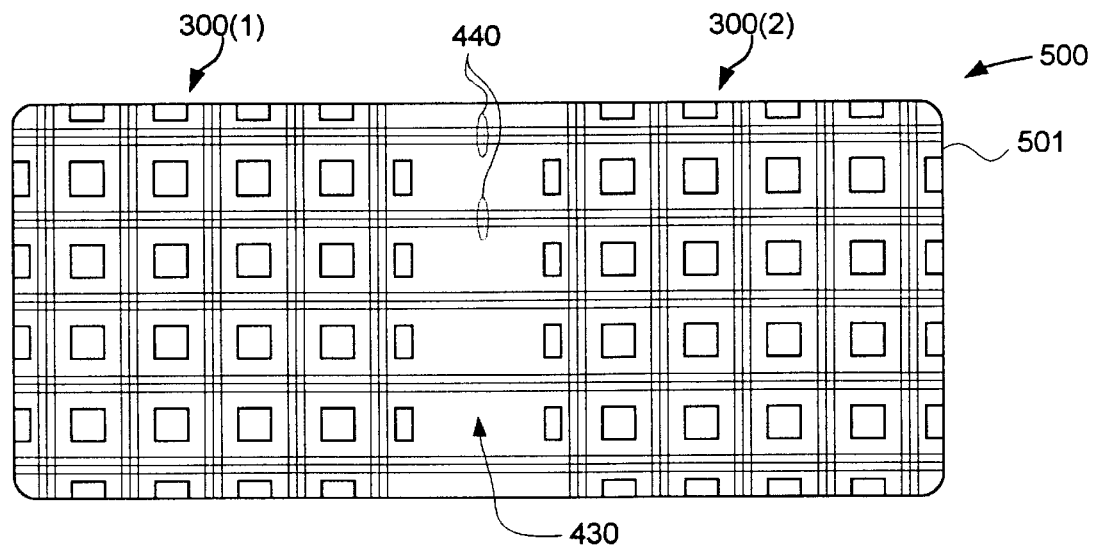
FIG. 5(A) is a simplified schematic diagram showing a first example of a multi-device PLD in accordance with the first embodiment of the present invention.

FIG. 5(A) is a plan view showing a multi-device PLD 500 in accordance with the present invention. Multi-device PLD 500 comprises a single (uncut and unbroken) chip 501 that is diced from wafer 400 (see FIG. 4(A)), and that includes FPGA circuit 300(1) and FPGA circuit 300(2) that are separated by scribe line space 430. FPGA circuit 300(1) and FPGA circuit 300(2) are selectively connected by device-linking conductors 440 that extend across scribe line space 430. Device-linking conductors 440 provide signal paths across scribe line space 430 that allow on-chip data signal transmissions between FPGA circuits 300(1) and 300(2). Because the data signals transmitted on device-linking conductors 440 between FPGA circuits 300(1) and 300(2) remain on chip 501, the signal delays associated with conventional multiple PLD applications are avoided. Further, the programmable interconnect resources of FPGA circuits 300(1) and 300(2) typically provide more signal paths for transmitting data signals between FPGA circuits 300(1) and 300(2) than the prior art method of providing signal transmissions over IOB-to-IOB connections. Therefore, the present invention provides a multi-device PLD including two or more discrete FPGA circuits in which signal transmission delays are minimized and in which the number of signal paths are increased because of the direct (on-chip) connections between the interconnect resources of the discrete FPGA circuits.

Figure 5B:
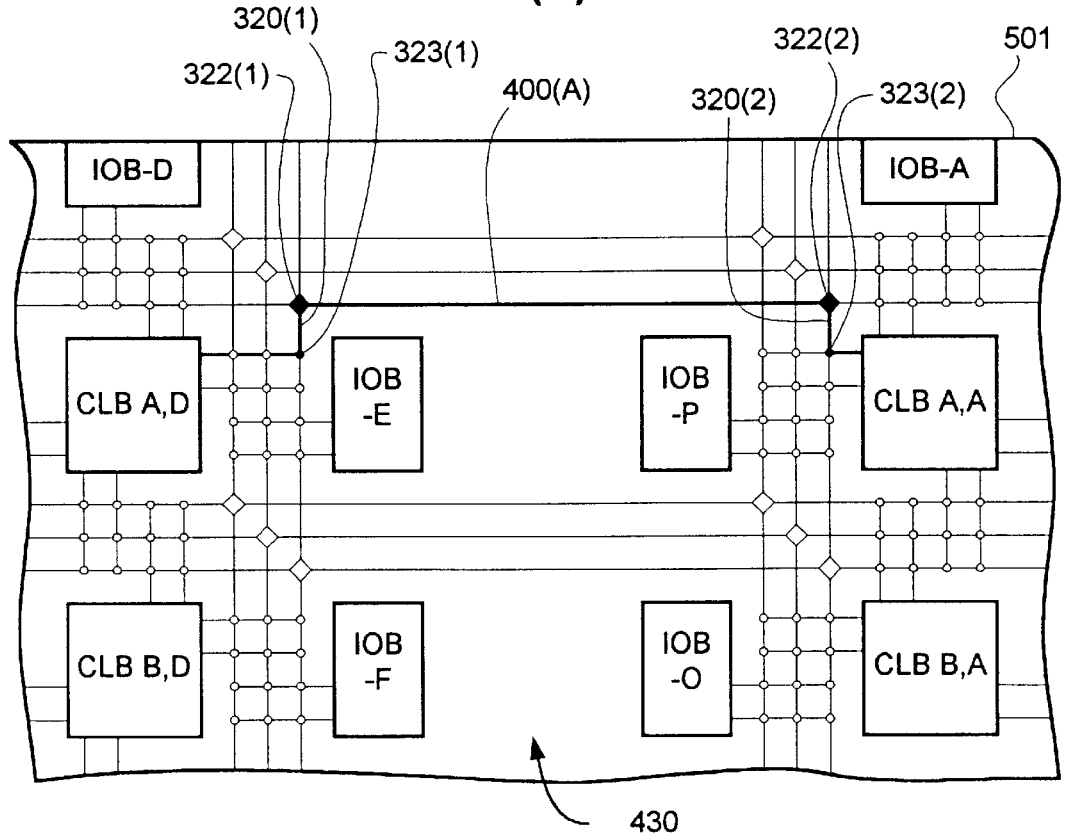
FIG. 5(B) is a partial plan view showing additional details of the multi-device PLD shown in FIG. 5(A).

FIG. 5(B) is an enlarged portion of multi-device PLD 500 depicting an example in which a data signal is transmitted on chip 501 from FPGA circuit 300(1) to FPGA circuit 300(2). The on-chip transmission path between FPGA circuits 300(1) and 300(2) is darkened for easy identification. A data signal output from CLB(A,D) of FPGA circuit 300(1) is transmitted via CLB-to-segment output switch 323(1) to vertical line segment 320(1). Vertical line segment 320(1) is connected via segment-to-segment switch 322(1) to device-linking conductor 440(A). Device-linking conductor 440(A) extends across scribe line space 430 and is connected to vertical line segment 320(2) of FPGA circuit 300(2) via segment-to-segment switch 322(2). Finally, vertical line segment 320(2) is connected to CLB(A,A) of FPGA circuit 300(2) via segment-to-CLB input switch 323(2). The on-chip transmission path shown in FIG. 5(B) illustrates an example of how on-chip signal transmissions between discrete FPGA circuits (i.e., across the scribe line spaces) are facilitated on multi-device PLD 500.

Figure 6:
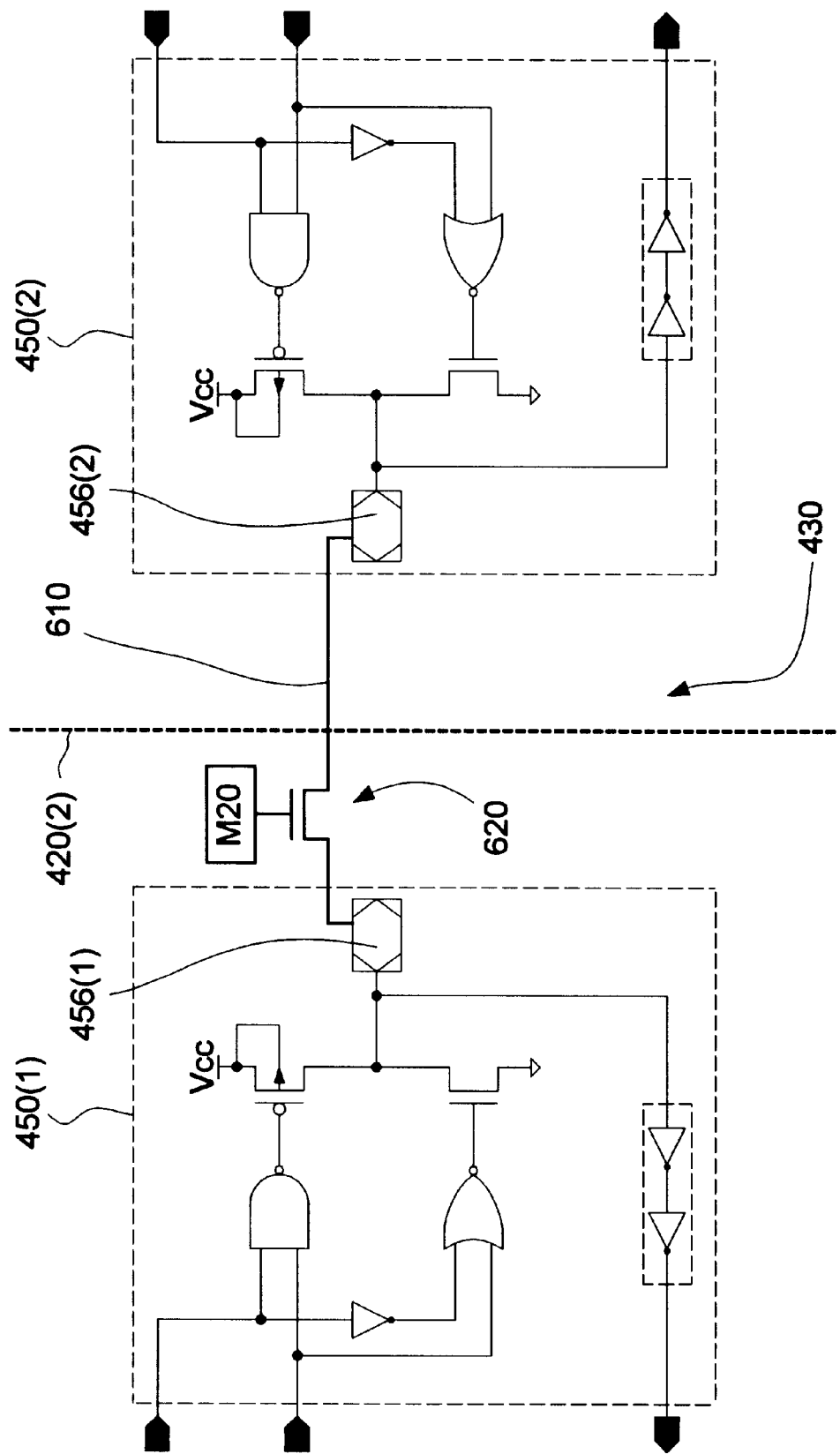
FIG. 6 is a circuit diagram illustrating a connection circuit utilized in an FPGA in accordance with a second embodiment of the present invention.

FIG. 6 shows a portion of a layout architecture in accordance with a second embodiment. In accordance with the second embodiment, the layout architecture includes device-linking conductors connected between the IOBs of adjacent FPGA circuits. In this example, bonding pad 456(1) of IOB 450(1) is selectively connected to bonding pad 456(2) of IOB 450(2) via an IOB-to-IOB device-linking conductor 610 that extends across scribe line space 430. Signal transmission on IOB-to-IOB device-linking conductor 610 passes through a pass gate 620, which is controlled by configuration memory cell M20. In another embodiment, the IOB-to-IOB device-linking conductor 610 may be provided in addition to the device-linking conductors connected between the interconnect resources, thereby further increasing the number of on-chip signal paths between discrete FPGA circuits of a multi-device PLD.

Figure 7A:
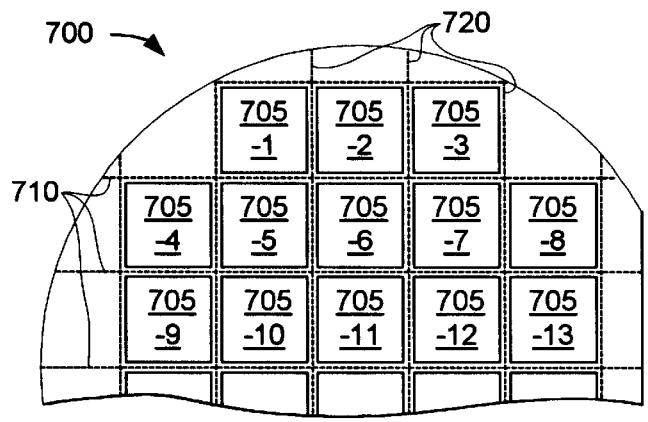
FIG. 7(A) is a simplified plan view showing a portion of a silicon wafer fabricated to include multiple FPGAs in accordance with a third embodiment of the present invention.

FIG. 7(A) is a simplified plan view showing a portion of a silicon wafer 700 that is fabricated to include a layout architecture in accordance with a third embodiment. Wafer 700 includes FPGA circuits 705-1 through 705-13 that are fabricated using known silicon processing techniques. Horizontal scribe lines 710 and vertical scribe lines 720 extend along scribe line spaces located between the rows and columns of FPGA circuits.

Figure 7B:
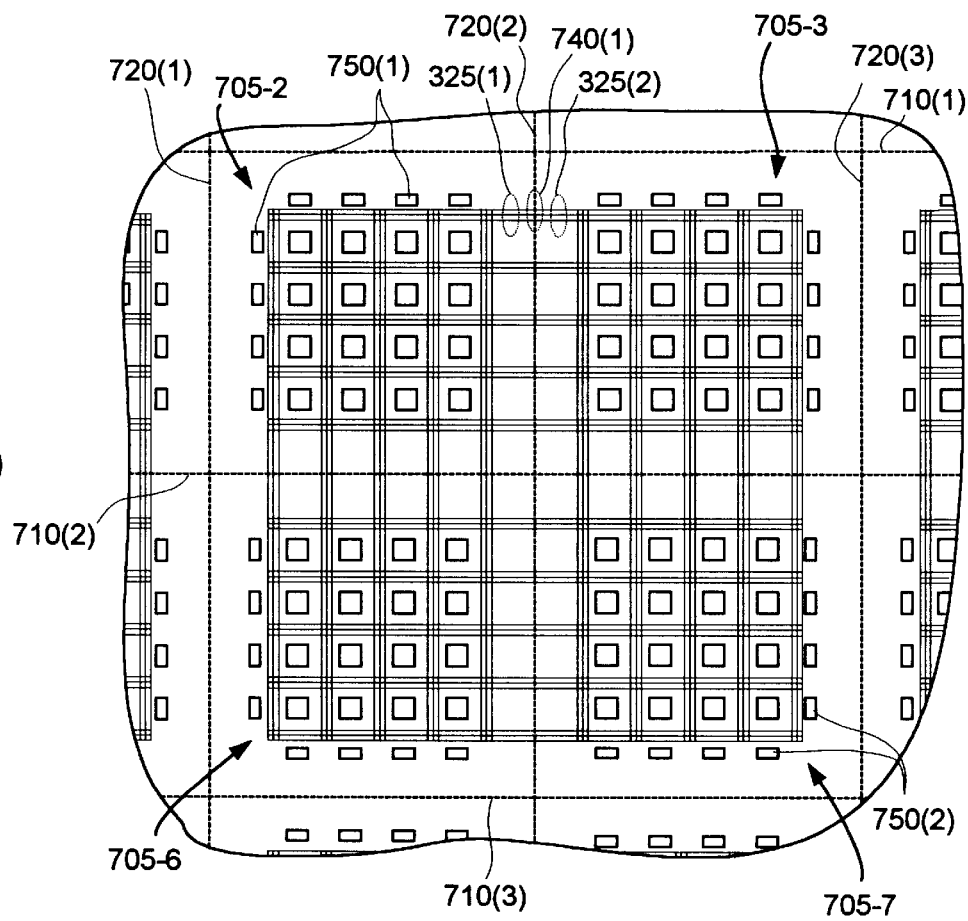
FIG. 7(B) is a partial plan view showing additional details of the wafer shown in FIG. 7(A).

FIG. 7(B) shows an enlarged portion of wafer 700, and illustrates additional details regarding the layout architecture of the third embodiment. In particular, FIG. 7(B) shows a portion of wafer 700 including FPGA circuits 705-2, 705-3, 705-6 and 705-7, each generally depicted with CLBs, IOBs and interconnect lines. FPGA circuits 705-2, 705-3, 705-6 and 705-7 are formed in an area of wafer 700 defined by horizontal scribe lines 710(1) and 710(3), and vertical scribe lines 720(1) and 720(3). In addition, horizontal scribe line 710(2) extends between FPGA circuits 705-2 and 705-6, and between FPGA circuits 705-3 and 705-7, and vertical scribe line 720(2) extends between FPGA circuits 705-2 and 705-3, and between FPGA circuits 705-6 and 705-7.

In accordance with the third embodiment, wafer 700 is fabricated with several associated groups, each group including four FPGA circuits. FPGA circuits 705-2, 705-3, 705-6 and 705-7, as shown in FIG. 7(B), form one such group. Each FPGA circuit of the group includes IOBs formed only along one horizontal edge and one vertical edge thereof. For example, referring to FIG. 7(B), FPGA circuit 705-2 includes IOBs 750(1) formed along a left edge and a top edge thereof, while IOBs 750(2) are formed along a right edge and a bottom edge of FPGA circuit 705-7. With this arrangement, if wafer 700 is diced along scribe lines 720(1), 720(3), 710(1) and 710(3), a multi-device PLD is formed that includes IOBs surrounding FPGA circuits 705-2, 705-3, 705-6 and 705-7. Conversely, if one or more of FPGA circuits 705-2, 705-3, 705-6 and 705-7 fail to function properly due to fabrication errors, the group can be separated along scribe lines 720(2) and 710(2) to form four separate single-device PLDS.

Also in accordance with the third embodiment, device-linking conductors selectively interconnect each group of four FPGA circuits on wafer 700. For example, FPGA circuit 705-2 includes horizontal end segments 325(1) that extend across vertical scribe line 720(2) and join horizontal end segments 325(2) of FPGA circuit 705-3 to form continuous device-linking conductors 740(1). Similar device-linking conductors are provided between FPGA circuits 705-3 and 705-7, between FPGA circuits 705-7 and 705-6, and between FPGA circuits 705-6 and 705-2. However, unlike the first embodiment (discussed above), device-linking conductors are not provided from FPGA circuits 705-2, 705-3, 705-6 and 705-7 to any other FPGA circuit on wafer 700. As such, the largest multi-device PLD that can be formed is limited to four FPGA circuits.

Although the present invention has been described in considerable detail with reference to certain preferred embodiments thereof, one of ordinary skill would recognize that variations to the disclosed embodiments are possible. Therefore, the spirit and scope of the appended claims should not be limited to the description of the preferred embodiments contained herein.

I claim:

1. A programmable logic device comprising:

a semiconductor chip;

a first programmable logic device circuit formed on the semiconductor chip; and a second programmable logic device circuit formed on the semiconductor chip and separated from the first programmable logic device circuit by a scribe line space;

wherein each of the first and second programmable logic device circuits include logic circuits and interconnect resources for selectively providing signal paths between the logic circuits, wherein a device-linking conductor extends from the first programmable logic device circuit to the second programmable logic device circuit across the scribe line space, wherein the interconnect resources of each of the first programmable logic device circuit and the second programmable logic device circuit includes a plurality of programmable switches for selectively connecting adjacent pairs the plurality of interconnect segments; and wherein each of the plurality of device-linking conductors is connected between a first programmable switch of the first programmable logic device circuit and a second programmable switch of the second programmable logic device circuit.

2. The programmable logic device according to claim 1:

wherein each of the first programmable logic device circuit and the second programmable logic device circuit comprises an array of configurable logic blocks, a plurality of input/output blocks located around a periphery of the configurable logic blocks, and programmable interconnect resources for selectively connecting the configurable logic blocks and input/output blocks; and wherein the device-linking conductor extends from the interconnect resources of the first programmable logic device circuit to the interconnect resources of the second programmable logic device circuit.

3. The programmable logic device according to claim 2:

wherein the interconnect resources of each of the first programmable logic device circuit and the second programmable logic device circuit includes a plurality of parallel interconnect segments; and wherein the programmable logic device includes a plurality of device-linking conductors extending across the scribe line space between the interconnect resources of the first programmable logic device circuit and the second programmable logic device circuit, each of the plurality of device-linking conductors being aligned with a first interconnect segment of the first programmable logic device circuit and a second interconnect segment of the second programmable logic device circuit.

4. The programmable logic device according to claim 1, wherein each of the programmable switches includes a plurality of normally-open pass transistors that selectively connect a selected device-linking conductor to one of an associated interconnect segment that is aligned with said selected device-linking conductor, a third interconnect segment extending perpendicular to the device-linking conductor and a fourth interconnect segment extending perpendicular to the device-linking conductor.

5. The programmable logic device according to claim 1, further comprising:

a third programmable logic device circuit formed on the semiconductor chip and separated from the first programmable logic device circuit by a second scribe line space; and a fourth programmable logic device circuit formed on the semiconductor chip and separated from the second programmable logic device circuit by a third scribe line space, and separated from the third programmable logic device circuit by a fourth scribe line space;

wherein each of the third and fourth programmable logic device circuits including logic circuits and interconnect resources for selectively providing signal paths between the logic circuits, wherein a second device-linking conductor extends from the first programmable logic device circuit to the third programmable logic device circuit across the second scribe line space, wherein a third device-linking conductor extends from the second programmable logic device circuit to the fourth programmable logic device circuit across the third scribe line space, and wherein a fourth device-linking conductor extends from the third programmable logic device circuit to the fourth programmable logic device circuit across the fourth scribe line space.

6. The programmable logic device according to claim 5:

wherein each of the first programmable logic device circuit, the second programmable logic device circuit, the third programmable logic device circuit and the fourth programmable logic device circuit comprises an array of configurable logic blocks, a plurality of input/output blocks located around a periphery of the configurable logic blocks, and programmable interconnect resources for selectively connecting the configurable logic blocks and input/output blocks; and wherein the first, second, third and fourth device-linking conductors extend between the interconnect resources of the first, second, third and fourth programmable logic device circuits.

7. A layout architecture formed on a semiconductor wafer comprising:

a first programmable logic device circuit formed on the wafer;

a second programmable logic device circuit formed on the wafer; and a scribe line space located between the first programmable logic device circuit and the second programmable logic device circuit;

wherein each of the first and second programmable logic device circuits include logic circuits and interconnect resources for selectively providing signal paths between the logic circuits, wherein a device-linking conductor extends from the first programmable logic device circuit to the second programmable logic device circuit across the scribe line space, wherein the interconnect resources of each of the first programmable logic device circuit and the second programmable logic device circuit includes a plurality of programmable switches for selectively connecting adjacent pairs the plurality of interconnect segments, and wherein each of the plurality of device-linking conductors is connected between a first programmable switch of the first programmable logic device circuit and a second programmable switch of the second programmable logic device circuit.

8. The layout architecture according to claim 7:

wherein each of the first programmable logic device circuit and the second programmable logic device circuit comprises an array of configurable logic blocks, a plurality of input/output blocks located around a periphery of the configurable logic blocks, and programmable interconnect resources for selectively connecting the configurable logic blocks and input/output blocks; and wherein the device-linking conductor extends from the interconnect resources of the first programmable logic device circuit to the interconnect resources of the second programmable logic device circuit.

9. The layout architecture according to claim 8:

wherein the interconnect resources of each of the first programmable logic device circuit and the second programmable logic device circuit includes a plurality of parallel interconnect segments; and wherein the layout architecture includes a plurality of device-linking conductors extending across the scribe line space between the interconnect resources of the first programmable logic device circuit and the second programmable logic device circuit, each of the plurality of device-linking conductors being aligned with a first interconnect segment of the first programmable logic device circuit and a second interconnect segment of the second programmable logic device circuit.

10. The layout architecture according to claim 7, wherein each of the programmable switches includes a plurality of normally-open pass transistors that selectively connect a selected device-linking conductor to one of an associated interconnect segment that is aligned with said selected device-linking conductor, a third interconnect segment extending perpendicular to the device-linking conductor and a fourth interconnect segment extending perpendicular to the device-linking conductor.

11. The layout architecture according to claim 7, further comprising:

a third programmable logic device circuit formed on the semiconductor wafer and separated from the first programmable logic device circuit by a second scribe line space; and a fourth programmable logic device circuit formed on the semiconductor wafer and separated from the second programmable logic device circuit by a third scribe line space, and separated from the third programmable logic device circuit by a fourth scribe line space;

wherein each of the third and fourth programmable logic device circuits including logic circuits and interconnect resources for selectively providing signal paths between the logic circuits, wherein a second device-linking conductor extends from the first programmable logic device circuit to the third programmable logic device circuit across the second scribe line space, wherein a third device-linking conductor extends from the second programmable logic device circuit to the fourth programmable logic device circuit across the third scribe line space, and wherein a fourth device-linking conductor extends from the third programmable logic device circuit to the fourth programmable logic device circuit across the fourth scribe line space.

12. The layout architecture according to claim 11:

wherein each of the first programmable logic device circuit, the second programmable logic device circuit, the third programmable logic device circuit and the fourth programmable logic device circuit comprises an array of configurable logic blocks, a plurality of input/output blocks located around a periphery of the configurable logic blocks, and programmable interconnect resources for selectively connecting the configurable logic blocks and input/output blocks; and wherein the first, second, third and fourth device-linking conductors extend between the interconnect resources of the first, second, third and fourth programmable logic device circuits.

* * * * *